(12) United States Patent
Esaka et al.

(10) Patent No.: US 8,681,121 B2
(45) Date of Patent: Mar. 25, 2014

(54) TOUCH PANEL AND DISPLAY DEVICE WITH TOUCH PANEL

(75) Inventors: Hiroshi Esaka, Mobara (JP); Shouji Ikeda, Chosei (JP); Kouichi Anno, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 665 days.

(21) Appl. No.: 12/954,976

(22) Filed: Nov. 29, 2010

(65) Prior Publication Data

US 2011/0128246 A1   Jun. 2, 2011

(30) Foreign Application Priority Data

Dec. 1, 2009   (JP) .................................. 2009-273054

(51) Int. Cl.
*G06F 3/045* (2006.01)
*G06F 3/041* (2006.01)
(52) U.S. Cl.
USPC ...... 345/174; 345/173; 178/18.03; 178/18.06
(58) Field of Classification Search
USPC ............... 345/156–157, 173–174; 178/18.01, 178/18.03, 18.06–18.07, 19.01, 19.03
See application file for complete search history.

(56) References Cited

U.S. PATENT DOCUMENTS

| | | | |
|---|---|---|---|
| 5,844,506 A * | 12/1998 | Binstead | 341/34 |
| 7,202,855 B2 | 4/2007 | Shigetaka et al. | |
| 8,531,409 B2 | 9/2013 | Matsuo et al. | |
| 2008/0309635 A1 * | 12/2008 | Matsuo | 345/173 |
| 2010/0053854 A1 | 3/2010 | Nishikawa et al. | |

FOREIGN PATENT DOCUMENTS

| | | |
|---|---|---|
| JP | UM 3001011 | 6/1994 |
| JP | 2003-099185 | 4/2003 |
| JP | 2007-18226 | 1/2007 |
| JP | 2008-310550 | 12/2008 |
| JP | 2009-237673 | 10/2009 |
| JP | 2009-282597 | 12/2009 |
| JP | 2010-257178 | 11/2010 |
| WO | WO 2007/008518 | 1/2007 |
| WO | WO 2007/091600 | 8/2007 |

* cited by examiner

*Primary Examiner* — Lun-Yi Lao
*Assistant Examiner* — Jarurat Suteerawongsa
(74) *Attorney, Agent, or Firm* — Antonelli, Terry, Stout & Krauss, LLP.

(57) ABSTRACT

An electrostatic capacitive coupling type touch panel in which a period before wiring formed outside an input region is chipped or wire-broken due to deterioration of a mask pattern can be prolonged. The touch panel has an input region and plural wirings formed around the input region. The input region has plural X electrodes and plural Y electrodes crossing the X electrodes. The plural wirings are connected to corresponding electrodes of the plural X electrodes and Y electrodes. The plural wirings respectively have a conductive layer and a metal layer formed on the conductive layer. The conductive layer is formed to be wider than the metal layer. The plural wirings have a corner. Among the plural wirings, in the wiring provided in the farthest position from the input region, the corner of the metal layer is chamfered.

20 Claims, 7 Drawing Sheets

FIG. 10 (Prior Art)
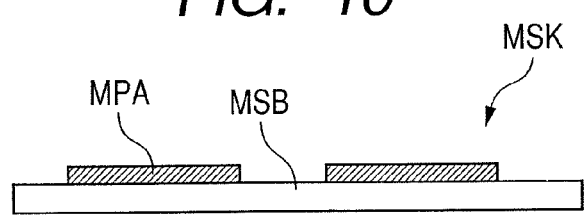
FIG. 11A (Prior Art)   FIG. 11B (Prior Art)
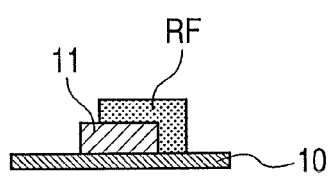   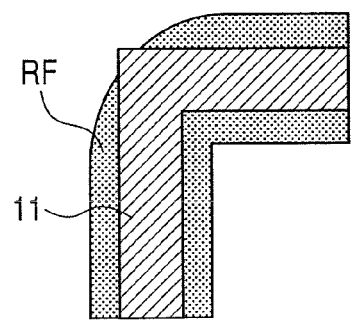
FIG. 12 (Prior Art)
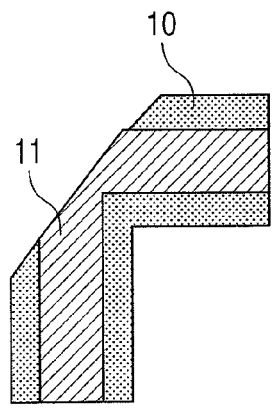

TOUCH PANEL AND DISPLAY DEVICE WITH TOUCH PANEL

CLAIM OF PRIORITY

The present application claims priority from Japanese Patent Application JP 2009-273054 filed on Dec. 1, 2009, the content of which is hereby incorporated by reference into this application.

BACKGROUND OF THE INVENTION

The present invention relates to a touch panel and a display device with a touch panel, and more particularly, to a technique preferably applicable to wiring formed outside an input region.

DESCRIPTION OF RELATED ART

In recent years, for propagation of mobile devices, a touch panel technique to support a "user friendly" graphical user interface has become more important.

As this touch panel technique, an electrostatic capacitive coupling type touch panel is known. As this electrostatic capacitive coupling type touch panel, a touch panel, where a touch position in which an observer's finger has touched is detected, is disclosed in JPA 2008-310550.

In this specification, an electrostatic capacitive coupling type touch panel is also called as an electrostatic capacitance type touch panel. They are also may be called a capacitive sensor. A touch panel may be called a touch sensor.

In the touch panel disclosed in JPA 2008-310550, a coupling capacitance between an electrode in an X direction and an electrode in a Y direction is detected so as to detect coordinates of a position where an observer has touched.

FIG. 7 is a plane view for explanation of the conventional electrostatic capacitive coupling type touch panel.

As shown in FIG. 7, the conventional electrostatic capacitive coupling type touch panel has plural X electrodes 1 and plural Y electrodes 2 crossing the X electrodes 1.

The plural X electrodes 1 respectively have an electrode pattern where a first part 1a and a second part 1b having a width greater than that of the first part 1a are alternately arranged. The plural Y electrodes 2 respectively have an electrode pattern where a first part 2a and a second part 2b having a width greater than that of the first part 2a are alternately arranged.

A region where the plural X electrodes 1 and the plural Y electrodes 2 are formed is an input region ERI. In a peripheral region provided around the input region ERI, plural wiring layers ML connected to the plural X electrodes 1 and the plural Y electrodes 2 are provided.

Note that as shown in FIG. 8, the wiring layer ML has a transparent conductive layer (ITO; Indium Tin Oxide) 10 as a lower layer and a metal layer 11 of silver alloy material or the like. Note that FIG. 8 is an enlarged view of a corner of the wiring layer ML show in FIG. 7.

The above-described wiring layer ML is formed in a process as shown in FIGS. 9A to 9D.

(1) A transparent conductive film F10 as a transparent conductive layer is formed on the entire surface of a substrate (e.g., a transparent substrate such as a glass substrate) 21 (FIG. 9A).

(2) Next, a metal film as the metal layer 11 is formed on the above-described transparent conductive film F10, and the metal layer 11 as an upper layer of the wiring layer ML is formed with a series of photolithographic technique (FIG. 9B).

(3) Next, a resist film is formed on the metal layer 11 using e.g. positive resist, then irradiated with light (e.g., ultraviolet light) using a transparent conductive layer formation photomask MSK, then the resist film is selectively developed, thereby a resist film RF is left only on the metal layer 11 (FIG. 9C).

(4) Next, the transparent conductive film F10 is etched by wet etching, thereby the resist film RF is removed, thus the transparent conductive film F10 is formed (FIG. 9D).

Note that generally, as shown in FIG. 10, in the transparent conductive layer formation photomask MSK, a mask pattern MPA for forming the transparent conductive layer 10 is formed, with a chrome (Cr) film, on a light (e.g. ultraviolet light) transmitting substrate MSB.

As the surface of the transparent conductive layer formation photomask MSK is contaminated by chemical reaction or the like of the resist film RF upon light irradiation, it is necessary to clean the transparent conductive layer formation photomask MSK.

However, the chrome film mask pattern MPA of the transparent conductive layer formation photomask MSK is deteriorated by the cleaning. Especially, the deterioration of the chrome film mask pattern MPA is serious at a corner of the wiring layer ML formed in a position farthest from the input region ERI.

Accordingly, it is conceivable that as shown in FIGS. 11A and 11B, the pattern of the resist film RF becomes thin due to the deterioration of the chrome film mask pattern MPA of the transparent conductive layer formation photomask MSK, then the corners become rounded, and a part of the metal layer 11 is protruded from the resist film RF. Note that FIGS. 11A and 11B are cross-sectional views showing the resist film RF, formed on the metal layer 11 using the transparent conductive layer formation photomask MSK in which the chrome film mask pattern MPA is deteriorated.

In the state shown in FIGS. 11A and 11B, when wet etching is performed so as to form the transparent conductive layer 10, the etchant erodes and etches the metal layer 11 as shown in FIG. 12, accordingly, the wiring layer ML becomes chipped or wire-broken.

SUMMARY OF THE INVENTION

The present invention has been made so as to address the above-described problem of the conventional technique, and provides a technique in a touch panel to prolong a period before wiring formed outside an input region is chipped or wire-broken due to deterioration of a mask pattern.

Among aspects of the present invention disclosed in the present application, the outline of typical aspect is as follows.

According to an aspect of the present invention, provided is an electrostatic capacitive coupling type touch panel having: an input region; and a plurality of wirings formed around the input region, the input region having a plurality of X electrodes and a plurality of Y electrodes crossing the X electrodes, the plurality of wirings respectively being connected to corresponding electrodes of the plurality of X electrodes and the plurality of Y electrodes, wherein the plurality of wirings respectively have: a conductive layer; and a metal layer formed on the conductive layer, wherein the conductive layer is formed to have a width greater than that of the metal layer, wherein the plurality of wirings have a corner, and wherein, in a wiring provided in a farthest position from the input region, among the plurality of wirings, the corner of the metal layer is chamfered.

In the touch panel, assuming that a width of a chamfered portion of the metal layer at the corner of the wiring formed in the farthest position from the input region is W1, and a mean value of the widths of the metal layers in linear portions of the wiring formed in the farthest position from the input region is W2, $0.8 \times W2 \leq W1 \leq 1.2 \times W2$ is satisfied.

Further, according to another aspect of the present invention, provided is an electrostatic capacitive coupling type touch panel having: an input region; and a plurality of wirings formed around the input region, the input region having a plurality of X electrodes and a plurality of Y electrodes crossing the X electrodes, the plural wirings respectively being connected to corresponding electrodes of the plurality of X electrodes and the plurality of Y electrodes, wherein the plurality of wirings respectively have: a conductive layer; and a metal layer formed on the conductive layer, wherein the conductive layer is formed to have a width greater than that of the metal layer, and wherein a dummy wiring, not connected to any of the plurality of X electrodes or the plurality of Y electrodes, is provided outside the wiring formed in a farthest position from the input region, among the plurality of wirings.

In the touch panel, the dummy wiring is supplied with a reference voltage.

In any one of the above-described touch panels, the conductive layer has a transparent conductive film.

In any one of the touch panel, the plurality of wirings respectively have an upper conductive layer provided on the metal layer with an insulating film therebetween, and the upper conductive layer is electrically connected to the conductive layer of the plurality of wirings.

In the above-described touch panel, the conductive layer and the upper conductive layer have a transparent conductive film.

In any one of the above-described touch panels, the X electrode and the Y electrode have a transparent conductive film.

In any one of the above-described touch panels, the X electrode and the Y electrode are formed with an insulating film therebetween.

In any one of the above-described touch panels, the X electrode and the Y electrode have an intersection part between the X electrode and the Y electrode and an electrode part formed between two intersection parts, the electrode part and the intersection part of the X electrode and the electrode part of the Y electrode are formed on the same layer, and the intersection part of the Y electrode is formed on a different layer, with an insulating layer therebetween.

Further, according to another aspect of the present invention, provided is a display device with touch panel wherein any one of the electrostatic capacitive coupling type touch panel is provided on a surface of a display panel on the observer side.

Among aspects of the present invention disclosed in the present application, the effects of typical aspect are as follows.

In accordance with the touch panel according to the present invention, it is possible to prolong a period before wiring formed on the outside of an input region is chipped or wire-broken due to deterioration of a mask pattern.

Other features and advantages of the present invention will be apparent from the following description taken in conjunction with the accompanying drawings.

BRIEF DESCRIPTION OF THE DRAWINGS

FIG. 10 is a cross-sectional view for explanation of a transparent conductive layer formation photomask;

FIGS. 11A and 11B are cross-sectional views showing the resist film RF, formed on the metal layer 11 using the transparent conductive layer formation photomask in which a chrome film mask pattern is deteriorated; and FIG. 12 is a cross-sectional view showing the wiring layer after etching in the state shown in FIG. 11.

DETAILED DESCRIPTION OF THE PREFERRED EMBODIMENTS

Figure 1:
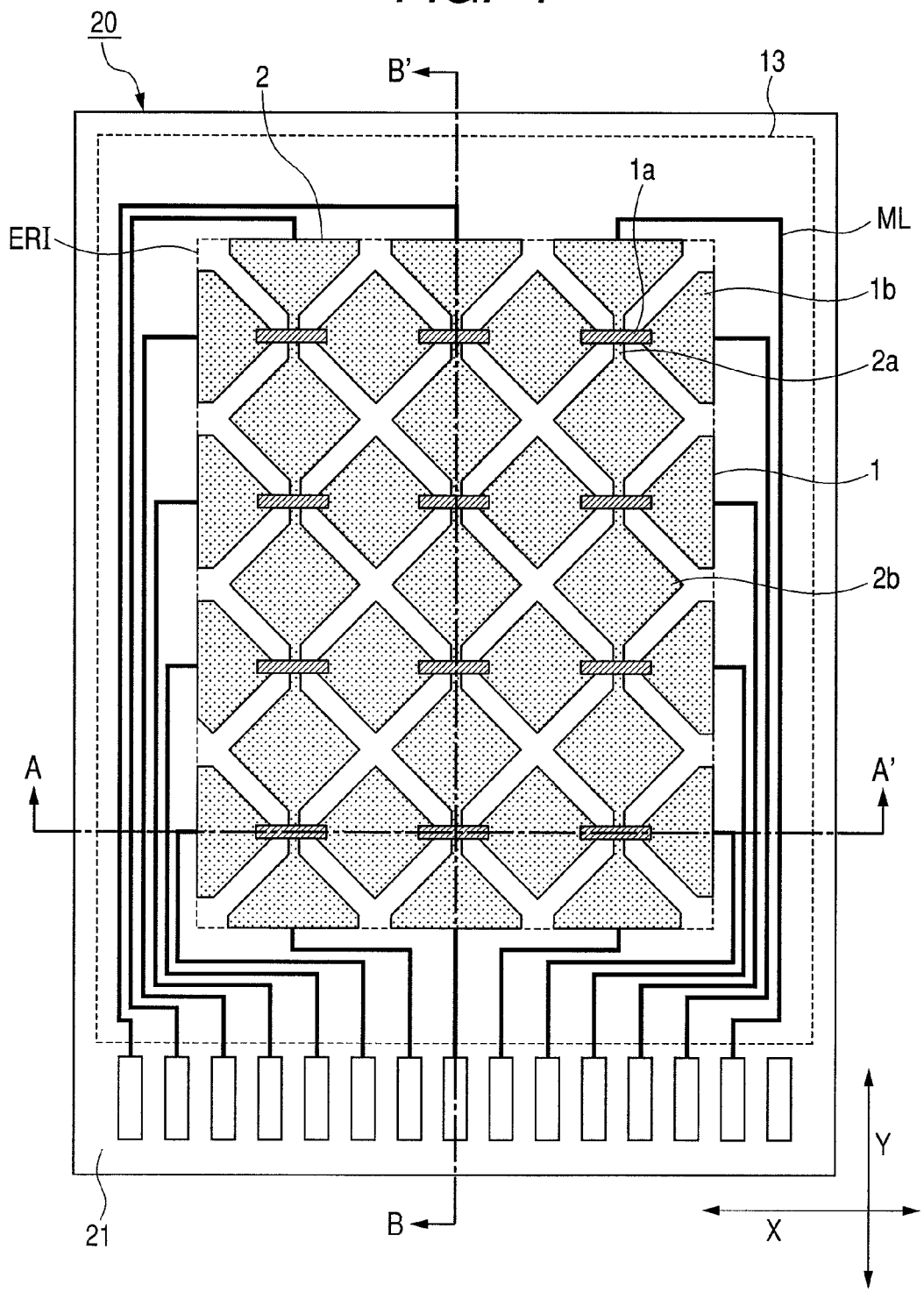
FIG. 1 is a plane view showing an electrode pattern of an electrostatic capacitance type touch panel as a presupposed element of the present invention.

Hereinbelow, embodiments of the present invention will be described in detail in accordance with the accompanying drawings.

Note that in all the figures for explanation of the embodiments, elements having the same function will have the same reference numerals and repeated explanations thereof will be omitted.

[Structure of Touch Panel as Presupposed Element of Present Invention]

FIG. 1 is a plane view showing an electrode pattern of an electrostatic capacitance type touch panel as a presupposed element of the present invention.

Figure 2:
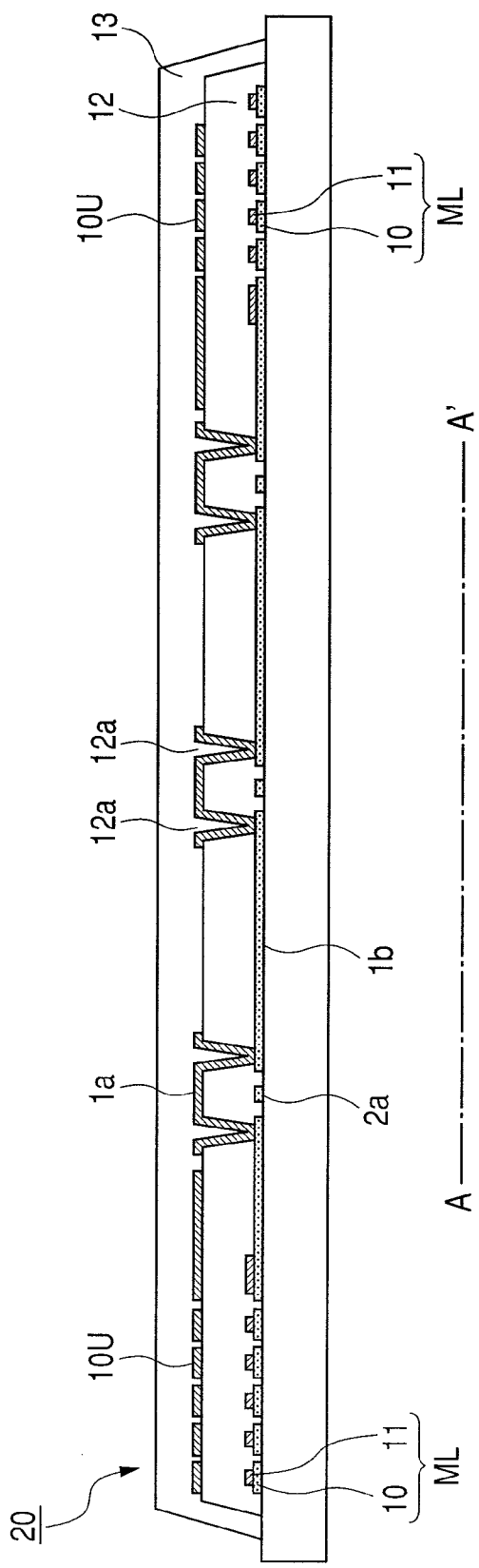
FIG. 2 is a cross-sectional view showing a structure along a line A-A' in FIG. 1.

FIG. 2 is a cross-sectional view showing a structure along a line A-A' in FIG. 1.

Figure 3:
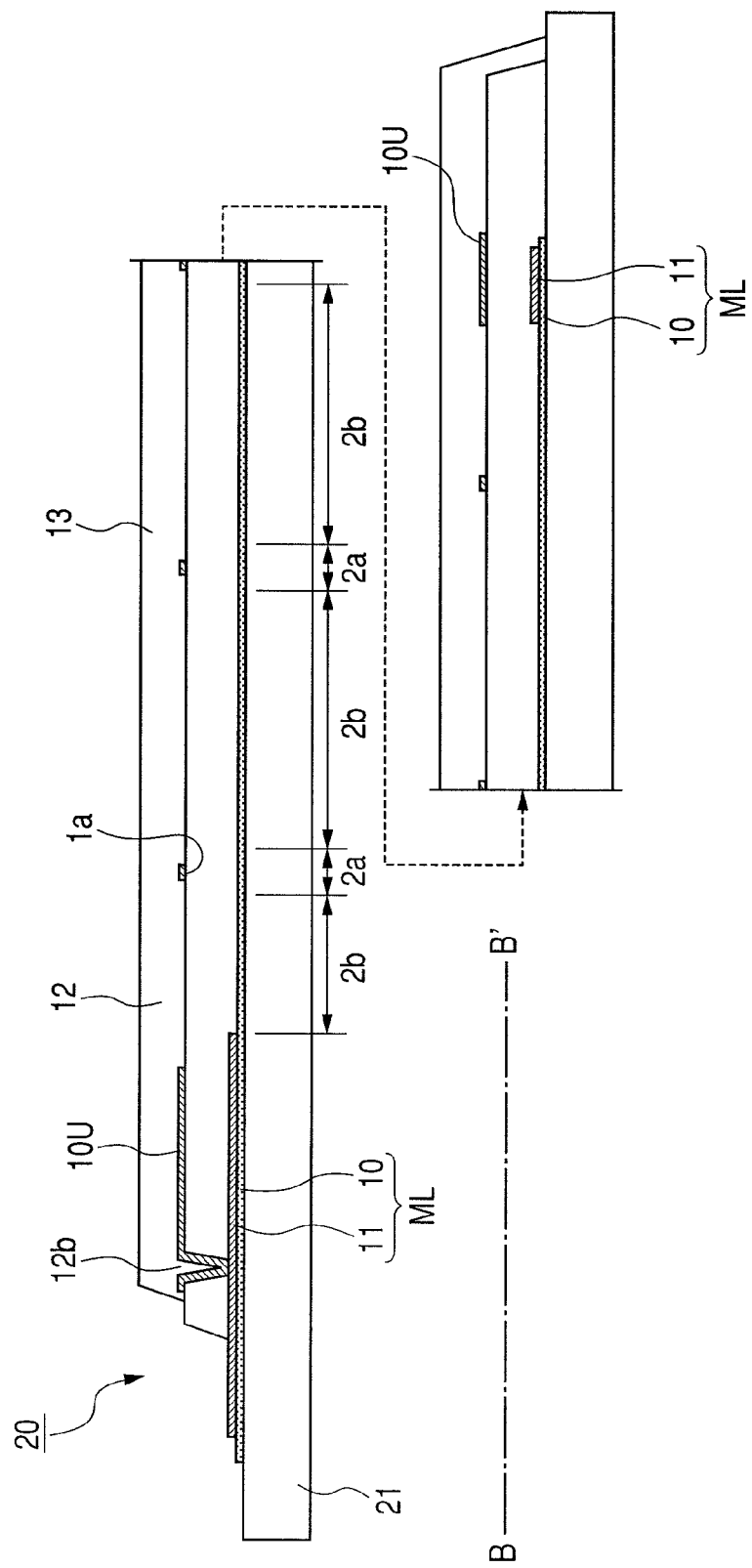
FIG. 3 is a cross-sectional view showing a structure along a line B-B' in FIG. 1.

FIG. 3 is a cross-sectional view showing a structure along a line B-B' in FIG. 1.

An electrostatic capacitance type touch panel 20, as a presupposed element of the present invention, has plural X electrodes 1, extended in a first direction (e.g. in an X direction) and provided in parallel at a predetermined array pitch in a second direction (e.g. a Y direction) crossing the first direction, and plural Y electrodes 2 extended in the second direction crossing the plural X electrodes 1 and provided in parallel at a predetermined array pitch in the first direction, on the surface of a substrate 21 on the observer side.

The plural Y electrodes 2 respectively have an electrode pattern where a first part 2a and a second part 2b having a width greater than that of the first part 2a are alternately arranged in the second direction. The plural Y electrodes 2 are provided on the surface of the substrate 21 on the observer side. As the substrate 21, a transparent insulating substrate such as a glass substrate is used.

The plural X electrodes 1 respectively have an electrode pattern where a first part 1a and a second part 1b having a width greater than that of the first part 1a are alternately arranged in the first direction. The first parts 1a of the plural X electrodes 1 are provided on an insulating film 12 formed on the surface of the substrate 21 on the observer side.

The second parts 1b of the plural X electrodes 1 are formed separately from the Y electrodes 2 on the surface of the substrate 21 on the observer side. Note that the first parts 1a of the plural X electrodes 1 are covered with a protective film 13 formed as an upper layer.

The first part 1a of the X electrode 1 two-dimensionally crosses the first part 2a of the Y electrode 2, and electrically connected to two adjacent second parts 1b with the first part 2a therebetween via a contact hole 12a formed in an insulating film 12 as an interlayer insulating film between the first part 1a of the X electrode 1 and the Y electrode 2.

In a plan view, the second part 2b of the Y electrode 2 is provided between the respective first parts 1a of two adjacent X electrodes 1. Also in a plan view, the second part 1b of the X electrode 1 is provided between the respective first parts 2a of two adjacent Y electrodes 2. That is, the Y electrode 2 has a portion wider than the width of a portion crossing the X electrode 1 between the X electrodes 1, and the X electrode 1 has a portion wider than the width of a portion crossing the Y electrode 2 between the Y electrodes 2.

A region where the plural Y electrodes 2 and X electrodes 1 are provided is an input region ERI. As shown in FIG. 1, plural wiring layers ML electrically connected to the respective plural Y electrodes 2 and the respective plural X electrodes 1 are provided around the input region ERI. The plural wiring layers ML electrically connect the plural Y electrodes 2 and the plural X electrodes 1 to drive circuits.

As shown in FIGS. 2 and 3, the plural wiring layers ML are provided on the surface (main surface) of the substrate 21 on the observer side, and covered with an insulating film 12 formed as an upper layer. The plural wiring layers ML are electrically connected to corresponding electrodes (the X electrodes 1 and the Y electrodes 2) at ends of the respective electrodes (the X electrodes 1 and the Y electrodes 2).

The plural X electrodes 1 and the plural Y electrodes 2 are formed with transparent conductive material or the like having high transparency such as ITO (Indium Tin Oxide). Further, the wiring layer ML has a transparent conductive layer 10 formed of transparent conductive material such as ITO as a lower layer and a metal layer 11 formed of e.g. silver alloy as an upper layer.

Further, each of the plural wiring layers ML is formed on the metal layer 11 with the insulating film 12 therebetween, and has an upper transparent conductive layer 10U of transparent conductive material such as ITO. The upper transparent conductive layers 10U are electrically connected to the respective transparent conductive layers 10 of the plural wiring layers ML via contact holes 12b formed in the insulating film 12 near the terminals of the wiring layer ML.

The touch panel 20 in the present embodiment receives a signal outputted from the drive circuit via a wiring on a flexible printed circuit board connected to one side of the touch panel 20.

Note that through holes are formed in the wirings on the flexible printed circuit board, and the wiring is electrically connected to crossing wiring on the rear side via the through hole. The crossing wirings cross a large number of wirings, and again connected to the wirings via through holes formed at the other end. In the present embodiment with this arrangement, the respective plural X electrodes 1 and plural Y electrodes 2 are supplied with driving voltages outputted from the drive circuits from both sides.

Next, the method of manufacturing the electrostatic capacitance type touch penal 20 as a presupposed element of the present invention will be described with reference to FIGS. 1 to 3.

Figure 9A:
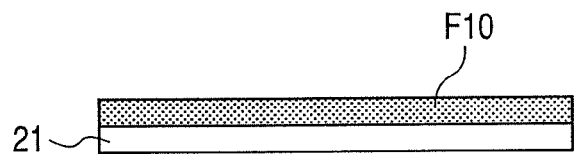
FIGS. 9A to 9D are cross-sectional views for explanation of a manufacturing method of the wiring layer in FIG. 7.

(1) First, a first transparent conductive film as a transparent conductive layer is formed on the entire surface of the substrate (e.g. a transparent substrate such as a glass substrate) 21 on the observer side (see above-described FIG. 9A).

Figure 9B:
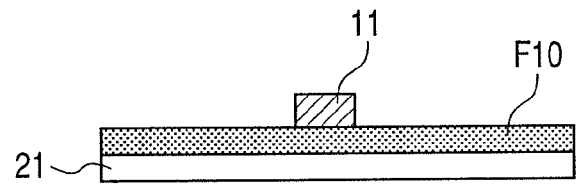

(2) Next, a metal film as the metal layer 11 is formed on the above-described first transparent conductive film, and the metal layer 11 as an upper layer of the wiring layer ML is formed by the photolithographic technique (see above-described FIG. 9B).

Figure 9C:
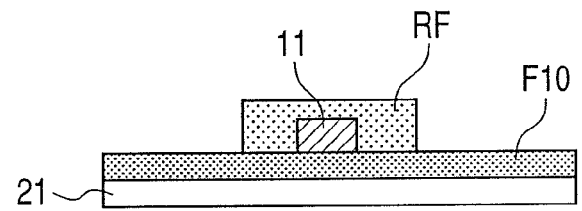
Figure 9D:
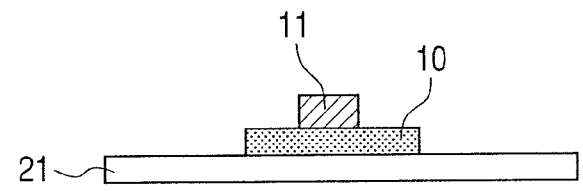

(3) Next, a first mask having an electrode pattern and wiring layer conductive film pattern is formed using e.g. positive resist on the metal layer 11. Then the first transparent conductive film is etched using the above-described first mask as an etching mask, thereby the plural Y electrodes 2, the second parts 1b of the plural X electrodes 1, and the transparent conductive layer 10 as a lower layer of the wiring layer ML are formed (see above-described FIGS. 9C and 9D). In this process, respective ends of the X electrodes 1 and the Y electrodes 2 are electrically connected to corresponding wiring layers ML.

(4) Next, the above-described first mask is removed, then, the insulating film 12 of e.g. negative resist is formed on the substrate 21 including the plural Y electrodes 2, the second parts 1b of the plural X electrodes 1 and the wiring layers ML. In this process, the plural Y electrodes 2, the second parts 1b of the plural X electrodes 1 and the wiring layers ML are covered with the insulating film 12.

(5) Next, the contact holes 12a and 12b are formed in necessary positions of the insulating film 12, then, a second transparent conductive film as a transparent conductive layer is formed on the entire surface of the insulating film 12 including the contact holes 12a and 12b.

(6) Next, a second mask having a pattern of the first parts 1a of the plural X electrodes 1 and the wiring layers LM is formed using e.g. positive resist on the transparent conductive film, then, the above-described second transparent conductive film is etched using the above-described second mask as an etching mask, thereby the first parts 1a of the plural X electrodes 1a and the upper transparent conductive layers 10U of the wiring layers ML are formed on the insulating film 12. In this process, the first parts 1a of the upper-layer plural X electrodes 1 are electrically connected to the second parts 1b of the lower-layer X electrodes 1 via the contact holes 12a. Further, the upper transparent conductive layers 10U of the respective wiring layers ML are electrically connected to the transparent conductive layers 10 of the respective wiring layers ML via the contact holes 12b.

(7) Next, the above-described second mask is removed, then the protective film 13 of e.g. negative resist is formed on the insulating film 12 including the first parts 1a of the plural X electrodes 1 and the upper transparent conductive layers 10U, thereby the structure shown in FIGS. 1 to 3 is obtained. In this process, the first parts 1a of the X electrodes 1 and the upper transparent conductive layers 10U are covered with the protective film 13.

Note that in the above explanation, it may be arranged such that the X electrodes 1 and the Y electrodes 2 are formed on different layers. For example, the Y electrodes 2 may be formed on the insulating film 12. In this case, it is necessary to electrically connect the Y electrodes 2 to the wiring layers ML via the contact holes formed in the insulating film 12.

[Embodiment 1]

Figure 4:
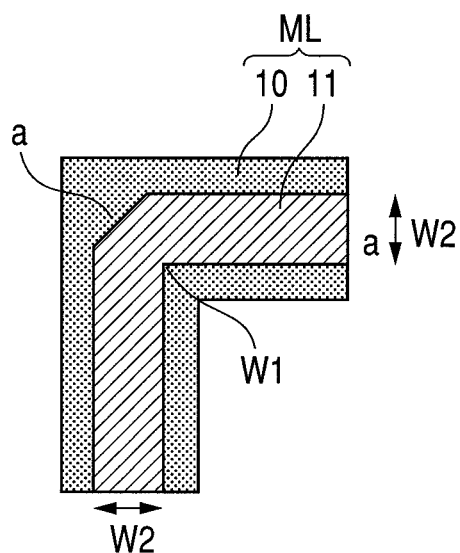
FIG. 4 is an enlarged view of a corner of a wiring layer provided in a farthest position from an input region among plural wiring layers provided in a peripheral region of the electrostatic capacitance type touch panel in an embodiment of the present invention.

FIG. 4 is an enlarged view of a corner of the wiring layer ML provided in a farthest position from the input region ERI among plural wiring layers ML provided in the peripheral region of the electrostatic capacitance type touch panel 20 in an embodiment 1 of the present invention.

As shown in FIG. 4, as the feature of the present embodiment, the pattern of a mask for formation of the metal layer 11 as an upper layer of the wiring layer ML is changed and the metal layer 11 is chamfered at corners of the wiring layer ML. Assuming that the minimum width (the width of a narrowest portion) of the chamfered portion of the metal layer 11 at a corner of the wiring layer ML is W1, and a mean value of widths of the metal layer 11 in linear portions of the wiring layer ML formed in the farthest position from the input region is W2, $0.8 \times W2 \leq W1 \leq 1.2 \times W2$ is satisfied.

In this arrangement, in the present embodiment, as shown in FIGS. 11A and 11B, even when the pattern of a resist film RF is thinned and the corners are rounded due to deterioration of a mask pattern MPA of a transparent conductive layer formation photomask MSK, a period before a part of the metal layer 11 is protruded from the resist film RF can be prolonged. That is, in the present embodiment, the tolerance to the protrusion of the metal layer 11 as an upper layer of the wiring layer ML from the resist film RF can be improved.

Accordingly, in the present embodiment, since a period before the wiring layer ML is chipped or wire-broken due to deterioration of the mask pattern MPA of the transparent conductive layer formation photomask MSK can be prolonged, the tolerance to wire-breakage of the wiring layer ML due to deterioration of the mask pattern MPA of the transparent conductive layer formation photomask MSK can be improved.

[Embodiment 2]

Figure 5:
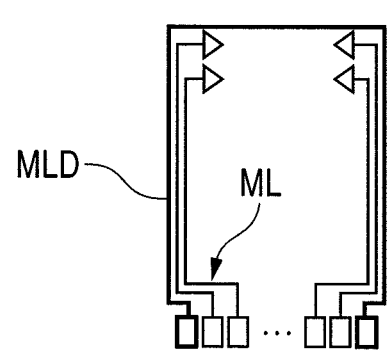
FIG. 5 is a schematic view of an arrangement of wiring layers ML provided in the peripheral region of the electrostatic capacitance type touch panel in the embodiment of the present invention.

FIG. 5 is a schematic view of an arrangement of the wiring layers ML provided in the peripheral region of the electrostatic capacitance type touch panel 20 in an embodiment 2 of the present invention.

As shown in FIG. 5, as the feature of the present embodiment, a dummy wiring layer MLD is formed outside the wiring layer ML provided in the farthest position from the input region ERI among the plural wiring layers ML. In the present embodiment, as in the case of the respective wiring layers ML, the dummy wiring layer MLD, having the transparent conductive layer 10 as a lower layer, the metal layer 11 as an upper layer and the upper transparent conductive layer 10U, is provided at the same interval as that of the respective wiring layers ML. Further, the dummy wiring layer MLD is not electrically connected to any of the plural Y electrodes 2 or the plural X electrodes 1.

Generally, the mask pattern MPA of the transparent conductive layer formation photomask MSK is deteriorated in the cleaning process for the transparent conductive layer formation photomask MSK. The deterioration of the transparent conductive layer formation mask pattern MPA of the outermost wiring layer ML is extremely serious, while the deterioration of the transparent conductive layer formation mask pattern MPA in an inner position is extremely slight.

Accordingly, in the present embodiment, since a period before the pattern of the resist film RF is thinned and the corners are rounded due to the deterioration of the mask pattern MPA of the transparent conductive layer formation photomask MSK can be prolonged, the period before a part of the metal layer 11 is protruded from the resist film RF can be prolonged. Accordingly, in the present embodiment, since the period before the wiring layer ML is chipped or wire-broken due to the deterioration of the mask pattern MPA of the transparent conductive layer formation photomask MSK can be prolonged, the tolerance to breakage of the wiring layer ML due to the deterioration of the mask pattern MPA of the transparent conductive layer formation photomask MSK can be improved. Note that in the present embodiment, it may be arranged such that a ground potential or the like is supplied to the dummy wiring layer MLD.

Figure 6:
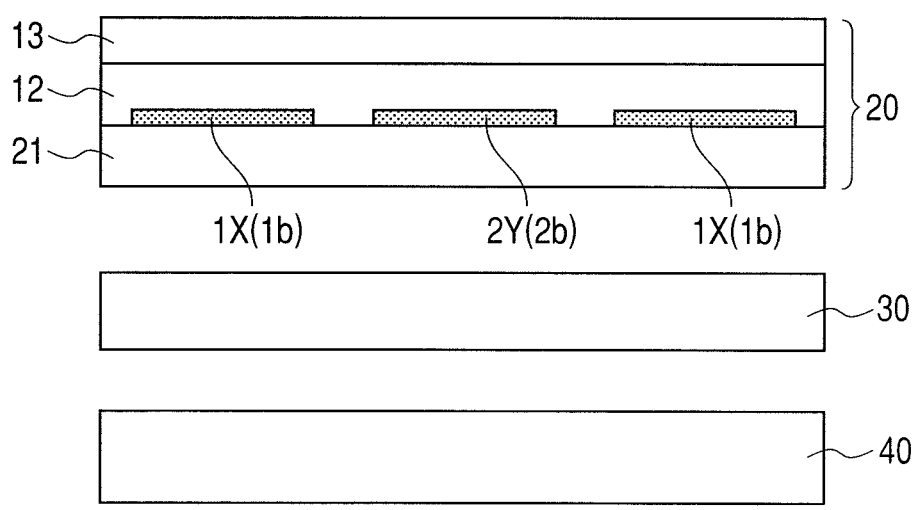
FIG. 6 is a schematic view of a display device with touch panel using the electrostatic capacitance type touch panel in the respective embodiments of the present invention.
Figure 7:
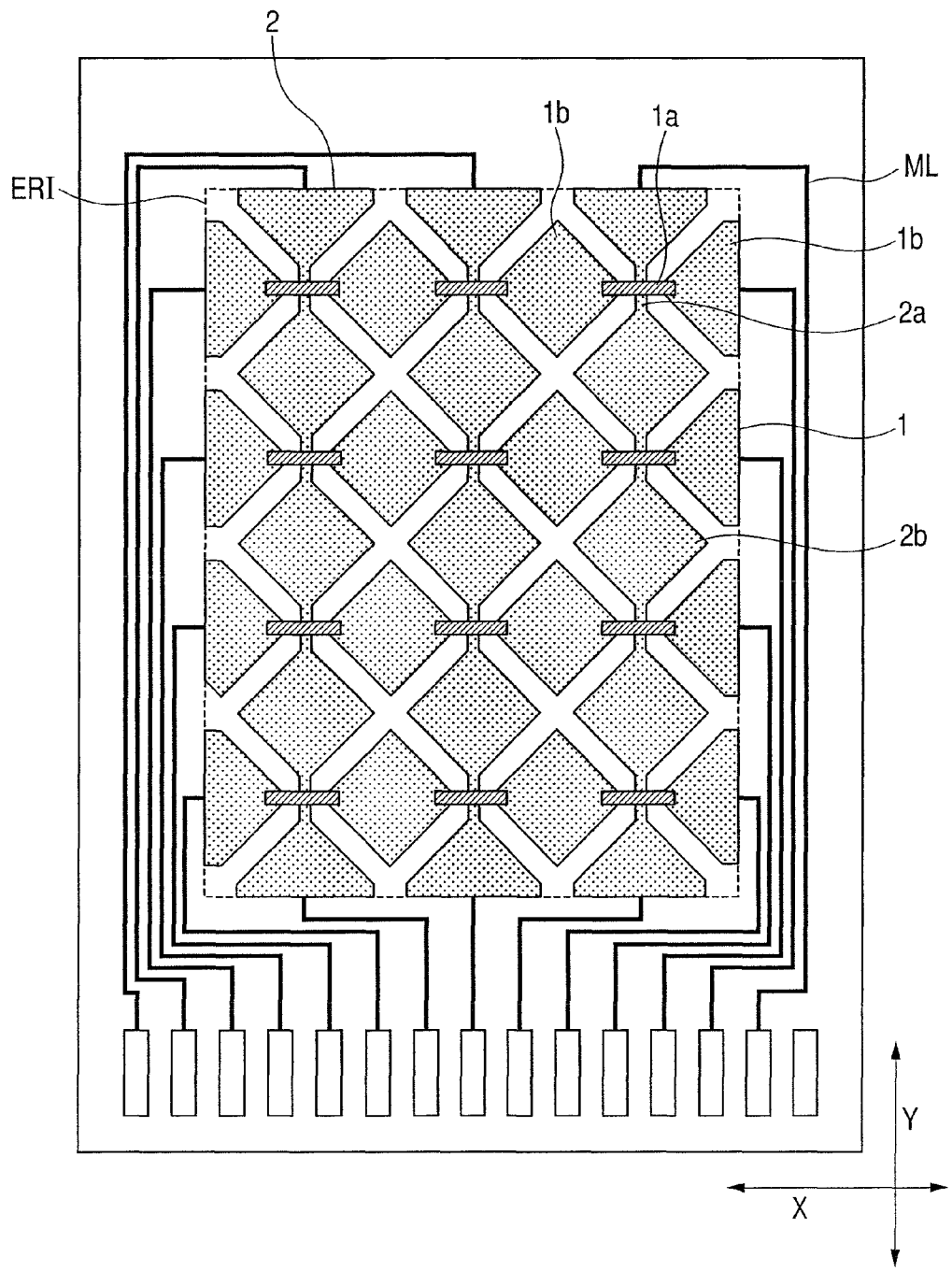
FIG. 7 is a plane view for explanation of a conventional electrostatic capacitive coupling type touch panel.
Figure 8:
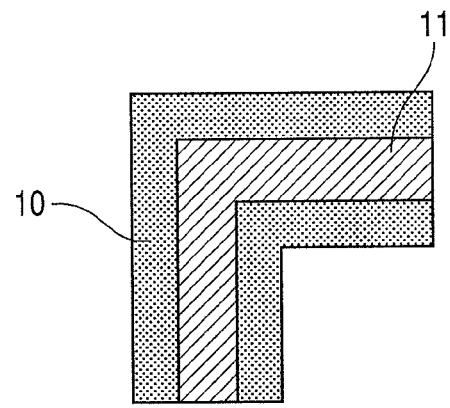
FIG. 8 is an enlarged view of a corner of the wiring layer ML in FIG. 7.

FIG. 6 is a schematic view of a display device with touch panel using the electrostatic capacitance type touch panel in the above-described embodiments.

The display device with touch panel shown in FIG. 6 has a liquid crystal display panel 30, the electrostatic capacitance type touch panel 20 in the above-described embodiments, provided on the surface of the liquid crystal display panel 30 on the observer side, and a backlight 40 provided under the surface of the liquid crystal display panel 30 on the side opposite to the observer side. As the liquid crystal display panel 30, an IPS type liquid crystal display panel, a TN type liquid crystal display panel, a VA type liquid crystal display panel or the like is used. The liquid crystal display panel 30 has a display region where plural pixels are provided in a matrix array and a non-display region provided around the display region.

Further, in FIG. 6, the display device with touch panel in which the touch panel is provided on the liquid crystal display panel is described as an example of the display panel. However, the present invention is not limited to this arrangement. The present invention is also applicable to a display device with touch panel in which the touch panel is provided on another display panel such as an organic EL display panel or an inorganic EL display panel.

The present invention made by the inventors has been specifically described based on the above-describe embodiments. However, the present invention is not limited to the above embodiments, and various changes can be made without departing from the scope of the present invention.

What is claimed is:

1. An electrostatic capacitive coupling type touch panel having:
    an input region; and
    a plurality of wirings formed around the input region;
    the input region having a plurality of X electrodes and a plurality of Y electrodes crossing the X electrodes;
    the plurality of wirings respectively being connected to corresponding electrodes of the plurality of X electrodes and the plurality of Y electrodes;
    wherein the plurality of wirings respectively have:
    a conductive layer; and
    a metal layer formed on the conductive layer;
    wherein the conductive layer is formed to have a width greater than that of the metal layer;
    wherein the plurality of wirings have a corner; and
    wherein, in a wiring provided in a farthest position from the input region, among the plurality of wirings, an outer edge of the corner of the metal layer is chamfered and an outer edge of the corner of the conductive layer is not chamfered.

2. The touch panel according to claim 1, wherein, assuming that a width of a chamfered portion of the metal layer at the corner of the wiring formed in the farthest position from the input region is W1, and a mean value of the widths of the metal layers in linear portions of the wiring formed in the farthest position from the input region is W2, $0.8 \times W2 \leq W1 \leq 1.2 \times W2$ is satisfied.

3. The touch panel according to claim 1, wherein the conductive layer has a transparent conductive film.

4. The touch panel according to claim 1,
wherein the plurality of wirings respectively have an upper conductive layer provided on the metal layer with an insulating film therebetween, and
wherein the upper conductive layer is electrically connected to the conductive layer of the plurality of wirings.

5. The touch panel according to claim 4, wherein the conductive layer and the upper conductive layer have a transparent conductive film.

6. The touch panel according to claim 1, wherein the X electrode and the Y electrode have a transparent conductive film.

7. The touch panel according to claim 1, wherein the X electrode and the Y electrode are formed with an insulating film therebetween.

8. The touch panel according to claim 1,
wherein the X electrode and the Y electrode have an intersection part between the X electrode and the Y electrode and an electrode part formed between two intersection parts,
wherein the electrode part and the intersection part of the X electrode and the electrode part of the Y electrode are formed on the same layer, and
wherein the intersection part of the Y electrode is formed on a different layer, with an insulating layer therebetween.

9. A display device with touch panel wherein the electrostatic capacitive coupling type touch panel in claim 1 is provided on a surface of a display panel on the observer side.

10. A display device with touch panel wherein the electrostatic capacitance type touch panel in claim 1 is provided on a surface of a display panel on the observer side.

11. The touch panel according to claim 1,
wherein, in the wiring provided in the farthest position from the input region, among the plurality of wirings, an inner edge of the corner of the metal layer is not chamfered and an inner edge of the corner of the conductive layer is not chamfered.

12. An electrostatic capacitive coupling type touch panel having:
an input region; and
a plurality of wirings formed around the input region;
the input region having a plurality of X electrodes and a plurality of Y electrodes crossing the X electrodes;
the plural wirings respectively being connected to corresponding electrodes of the plurality of X electrodes and the plurality of Y electrodes;
wherein the plurality of wirings respectively have:
a conductive layer; and
a metal layer formed on the conductive layer;
wherein the conductive layer is formed to have a width greater than that of the metal layer;
wherein the plurality of wirings have a corner;
wherein, in a wiring provided in a farthest position from the input region, among the plurality of wirings, an outer edge of the corner of the metal layer is chamfered and an outer edge of the corner of the conductive layer is not chamfered; and
wherein a dummy wiring, not connected to any of the plurality of X electrodes or the plurality of Y electrodes, is provided outside the wiring formed in a farthest position from the input region, among the plurality of wirings.

13. The touch panel according to claim 12, wherein the dummy wiring is supplied with a reference voltage.

14. The touch panel according to claim 12, wherein the conductive layer has a transparent conductive film.

15. The touch panel according to claim 12,
wherein the plurality of wirings respectively have an upper conductive layer provided on the metal layer with an insulating film therebetween, and
wherein the upper conductive layer is electrically connected to the conductive layer of the plurality of wirings.

16. The touch panel according to claim 15, wherein the conductive layer and the upper conductive layer have a transparent conductive film.

17. The touch panel according to claim 12, wherein the X electrode and the Y electrode have a transparent conductive film.

18. The touch panel according to claim 12, wherein the X electrode and the Y electrode are formed with an insulating film therebetween.

19. The touch panel according to claim 12,
wherein the X electrode and the Y electrode have an intersection part between the X electrode and the Y electrode and an electrode part formed between two intersection parts,
wherein the electrode part and the intersection part of the X electrode and the electrode part of the Y electrode are formed on the same layer, and
wherein the intersection part of the Y electrode is formed on a different layer, with an insulating layer therebetween.

20. The touch panel according to claim 12,
wherein in the wiring provided in the farthest position from the input region, among the plurality of wirings, an inner edge of the corner of the metal layer is not chamfered and an inner edge of the corner of the conductive layer is not chamfered.

* * * * *